United States Patent [19]
Nagayama et al.

[11] Patent Number: 6,137,220
[45] Date of Patent: *Oct. 24, 2000

[54] ORGANIC ELECTROLUMINESCENT DISPLAY WITH PROTECTIVE FILM AND TRAPEZOIDAL WALLS

[75] Inventors: Kenichi Nagayama; Ryuji Murayama, both of Yamagata-ken, Japan

[73] Assignee: Tohoku Pioneer Electronic, Yamagata-Ken, Japan

[*] Notice: This patent is subject to a terminal disclaimer.

[21] Appl. No.: 09/071,170

[22] Filed: May 4, 1998

[30] Foreign Application Priority Data

May 9, 1997 [JP] Japan ................................. 9-136011

[51] Int. Cl.[7] ........................................................ H01J 1/62
[52] U.S. Cl. ............................ 313/504; 313/506; 313/507
[58] Field of Search ..................................... 313/483, 498, 313/503, 504, 505, 506, 507, 509, 512

[56] References Cited

U.S. PATENT DOCUMENTS

| | | | |
|---|---|---|---|
| 5,457,357 | 10/1995 | Fujii et al. ............................... | 313/506 |
| 5,701,055 | 12/1997 | Nagayama et al. ...................... | 313/504 |
| 5,742,129 | 4/1998 | Nagayama et al. ...................... | 315/167 |
| 5,952,037 | 9/1999 | Nagayama et al. ....................... | 427/66 |
| 5,962,970 | 10/1999 | Yokoi et al. ............................. | 313/506 |

*Primary Examiner*—Nimeshkumar D. Patel
*Assistant Examiner*—Matthew J. Gerike
*Attorney, Agent, or Firm*—Arent Fox Kintner Plotkin & Kahn, PLLC

[57] ABSTRACT

A display panel using an organic electroluminescent material, includes: a substrate; a plurality of first type electrodes formed on the surface of one side of the substrate; a plurality of electrically insulating partition walls partially covering the first type electrodes; a plurality of organic electroluminescent layers formed on exposed portions of the first type electrodes; a plurality of second type electrodes formed on the organic electroluminescent layers; and a protection layer formed on the above one side of the substrate to cover and seal up the first type electrodes, the electrically insulating partition walls, the organic electroluminescent layers, and the second type electrodes. In particular, the protection layer has a plurality of openings each of which is formed adjacent to a side face of a partition wall so as to partially expose the side face.

7 Claims, 14 Drawing Sheets

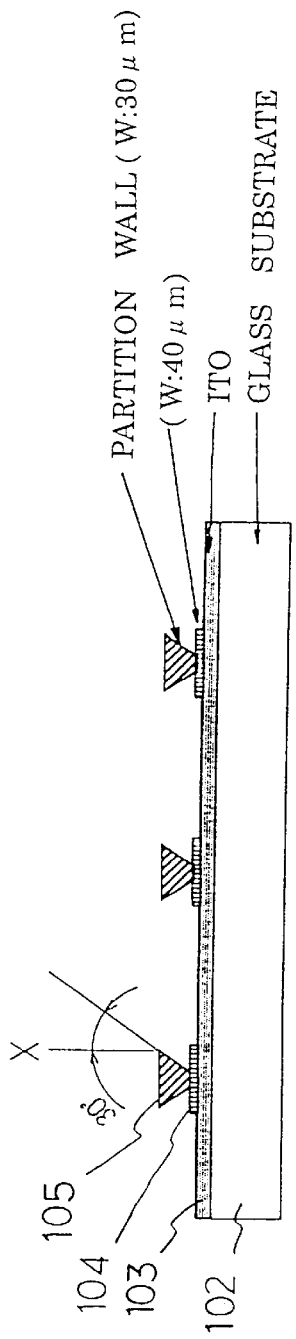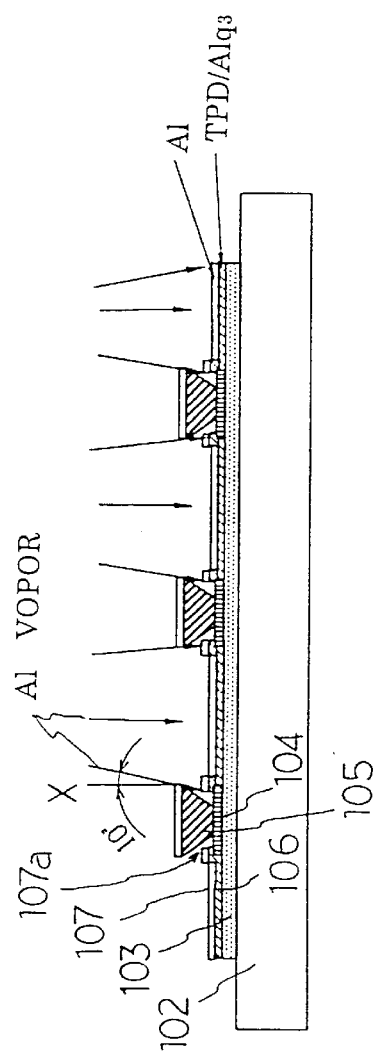

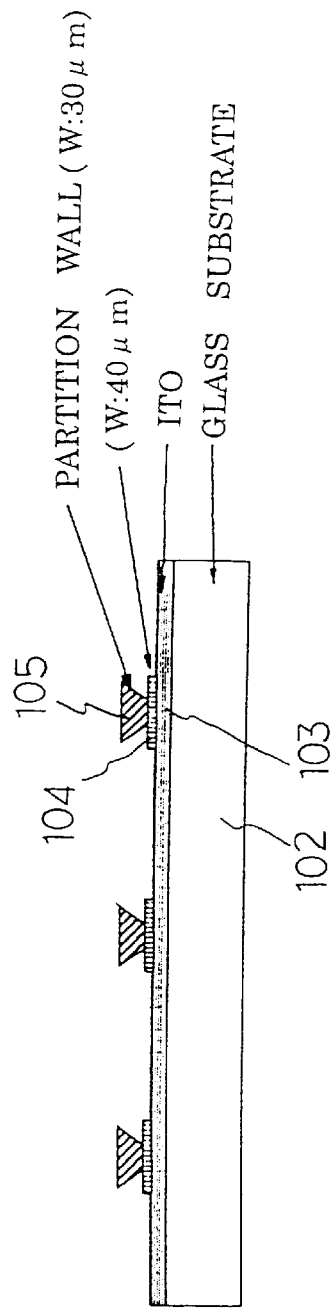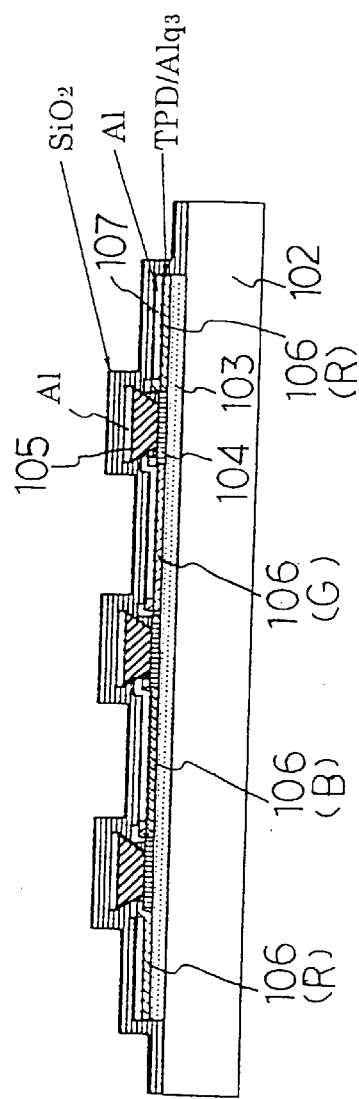

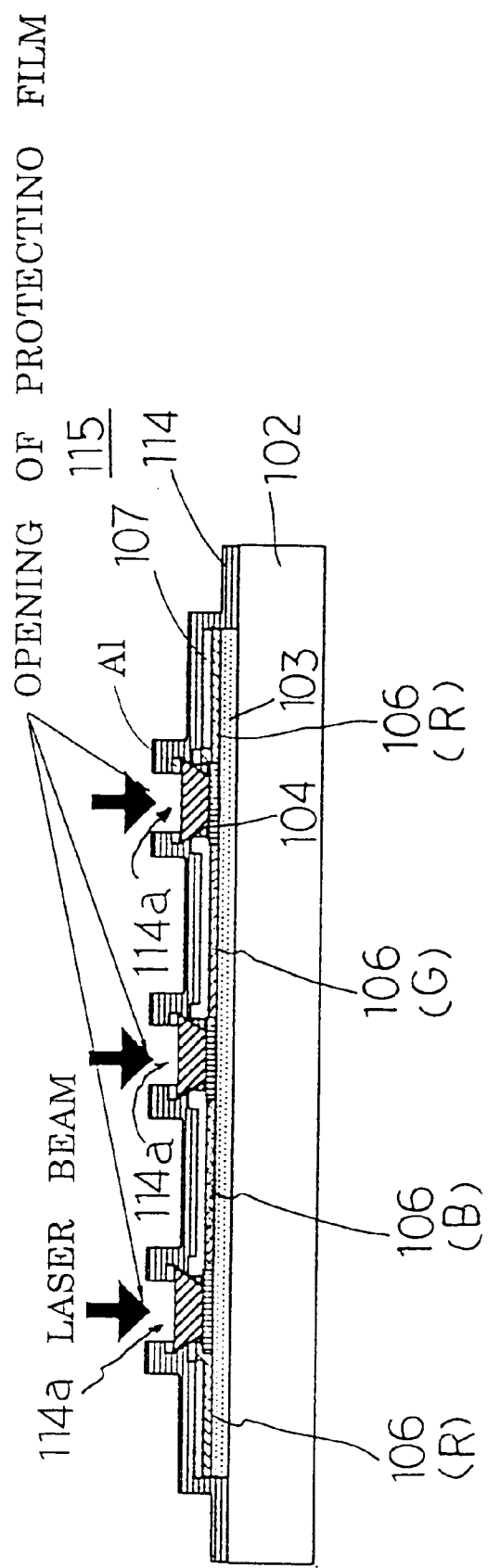

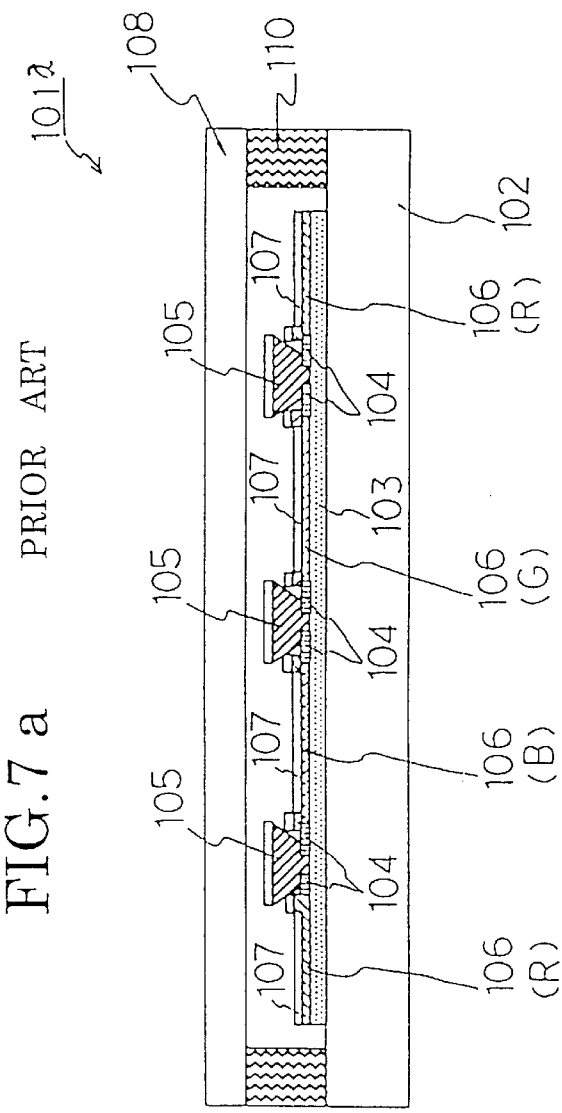
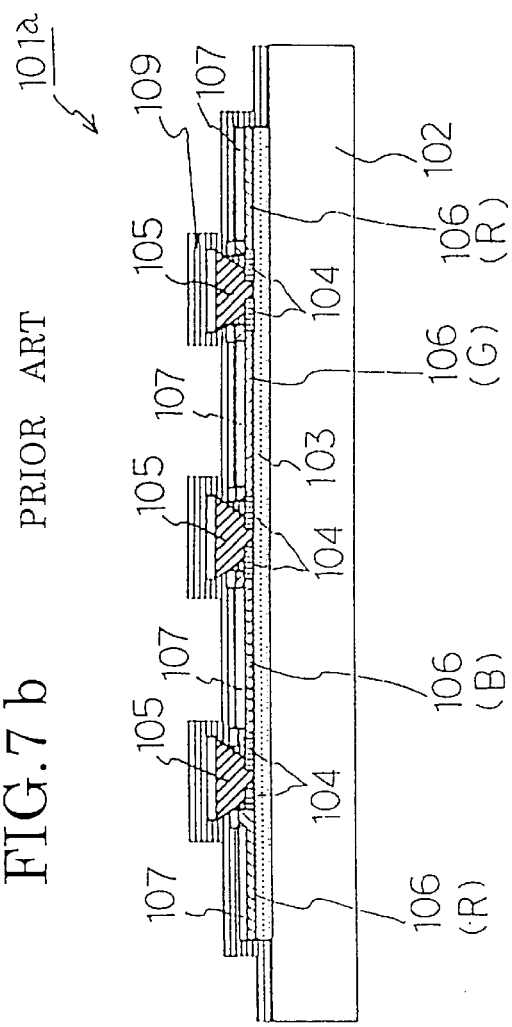

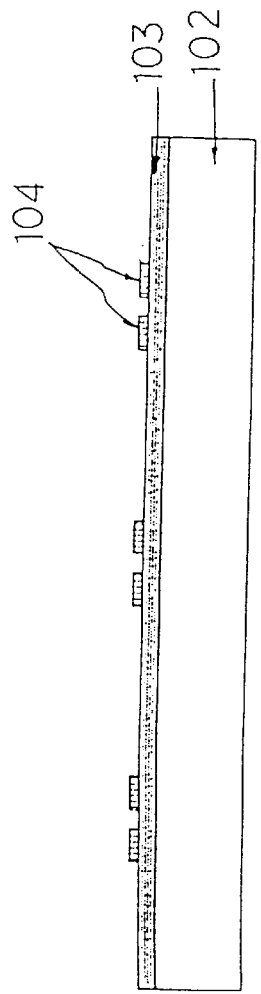
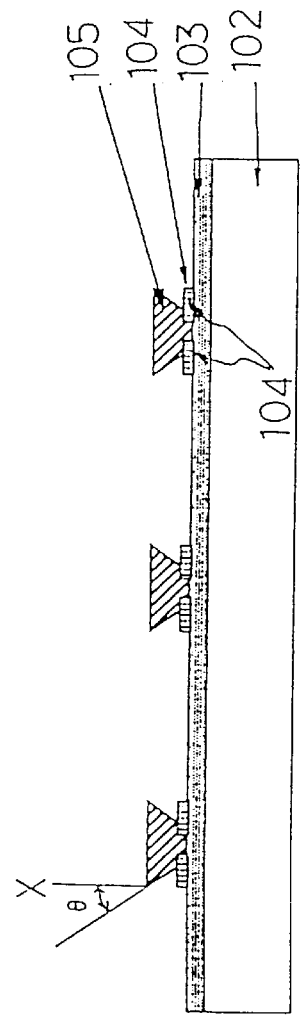

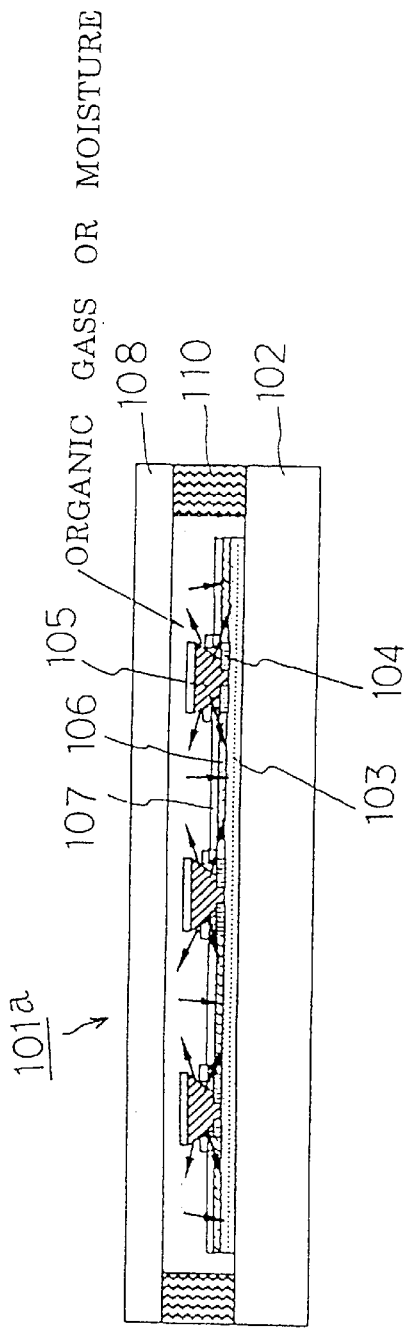
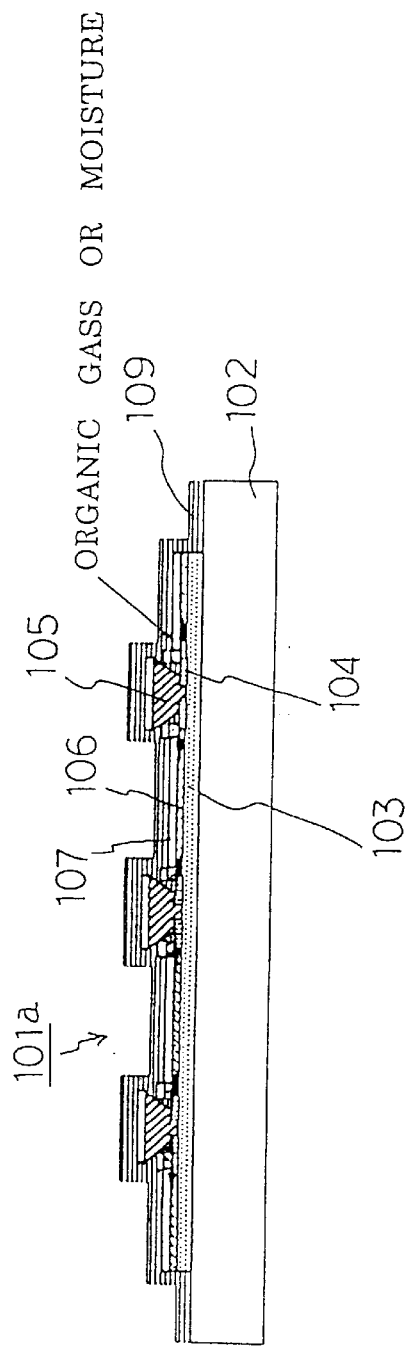

ORGANIC ELECTROLUMINESCENT DISPLAY WITH PROTECTIVE FILM AND TRAPEZOIDAL WALLS

ORGANIC ELECTROLUMINESCENT DISPLAY WITH PROTECTIVE FILM AND TRAPEZOIDAL WALLS

FIELD OF THE INVENTION

The present invention relates to a display panel and a method for the manufacture thereof, in particular to a display panel using organic electroluminescent material and a method for manufacturing the same.

FIG. 5 illustrates an arrangement of luminescent picture elements in a conventional full-color display panel using organic electroluminescent material. As shown in FIG. 5, the conventional display panel has a plurality of luminescent picture elements 101 arranged in matrix manner. Each picture element 101 includes a red luminescent unit R, a green luminescent unit G and a blue luminescent unit B, all extending in a predetermined direction so as to form a stripe pattern on the display.

FIG. 6 illustrates the structure of a base section 101a mounting the luminescent picture elements 101. As shown in FIG. 6, the base section 101a has a plurality of first type electrodes 103 consisting of ITO, which are formed on the surface of one side of a transparent glass substrate 102. Further, a plurality of electrically insulating layers 104 and a plurality of electrically insulating partition walls 105 are provided at a predetermined interval over the first type electrodes 103 on the glass substrate 102, in a manner such that both the layers 104 and the walls 105 are orthogonal to and partially cover the electrodes 103.

Referring again to FIG. 6, a plurality of thin layers 106 of an organic electroluminescent material are formed in parallel with the layers 104 and partition walls 105 on exposed portions of the electrodes 103, a plurality of second type electrodes 107 are formed over the thin layers 106 so that both the electrodes 107 and the thin layers 106 are arranged in the same direction as the partition walls 105.

As shown in FIG. 6, the plurality of second type electrodes 107 are separated from one another by the partition walls 105 so as to prevent a possible electric short between two adjacent electrodes 107. Further, in order to exactly separate two adjacent electrodes 107, it is preferred that each partition wall 105 be formed to have an inverted trapezoidal cross section.

However, since both the electroluminescent layers 106 and the partition walls 105 are all apt to be affected by a moisture, it is necessary to provide a glass cover or a protection layer over the transparent glass substrate 102 to cover up the organic electroluminescent layers 106 and the partition walls 105, as shown in FIG. 7. FIG. 7a is a cross sectional view illustrating a display panel base section 101a including a plurality of picture elements which are sealed up by a glass cover 108. FIG. 7b is a cross sectional view illustrating a display panel base section 101a including a plurality of picture elements which are sealed up by a protection layer 109 having a desired moisture proof property.

In use, the first type electrodes 103 and the second type electrodes 107 are energized, so that some portions of the organic electroluminescent layers 106 corresponding to intersections of the first type electrodes 103 and the second type electrodes 107, are caused to emit lights which are displayed through the transparent glass substrate 102.

A process for manufacturing a display panel base section 101a may be described in the following with reference to FIGS. 8a–8d.

At first, as shown in FIG. 8a, a plurality of first type electrodes 103 consisting of an electrically conductive transparent material such as IT0 are formed on the transparent glass substrate 102. Then, a plurality of elongate electrically insulating layers 104 are formed in a direction orthogonal to the first type electrodes 103. Afterwards, as shown in FIG. 8b, a plurality of partition walls 105 are formed in parallel with the elongate electrically insulating layers 104 on the glass substrate 102. Each partition wall 105 has a cross section formed into an inverted trapezoidal shape having an overhang angle θ with a vertical axis X.

Subsequently, as shown in FIG. 8c, with the use of a mask 111 punched in accordance with a predetermined pattern, the organic electroluminescent layers 106 corresponding to red luminescent unit R, green luminescent unit G and blue luminescent unit B, are formed on exposed portions of the first type electrodes 103.

Finally, as shown in FIG. 8d, a metal of low electric resistance such as Al, Cu or Au is vapor deposited on the organic electroluminescent layers 106 so as to form thereon a plurality of second type electrodes 107.

When the above metals are vapor deposited, the deposition direction is usually controlled within an angle θ1 which is smaller than the above angle θ, so that the metals may be prevented from being deposited onto the side faces of the partition walls 105. In this way, the metals deposited on the top of each partition wall 105 is separated from adjacent second type electrodes 107, thereby preventing any possible short between two adjacent electrodes 107.

Further, a glass cover 108 is bonded onto the glass substrate 102 by means of an adhesive 110, and an inactive gas is introduced into an internal space defined by the glass substrate 102, adhesive 110 and the glass cover 108, so as to effectively seal up the elements 103–107 in the display panel base section 101a (preventing a possible moisture from outside), as shown in FIG. 7a.

Alternatively, after a step shown in FIG. 8d, a protection layer 109 having a low moisture permeability may is formed to cover up the whole surface (including the elements 103–107) on one side of the glass substrate 102, as shown in FIG. 7B.

However, the material forming the partition walls 105 is usually an organic substance such as a photoresist, which is easy to be formed (by way of etching) to obtain a cross section of an inverted trapezoid, and has a high moisture absorbing capacity. Thus, such a photoresist, due to its specific molecular structure and its high capability of water adsorption, will possibly emit moisture and organic gas if under a high temperature.

Under a condition shown in FIG. 7a where a glass cover 108 is used to seal up the elements 103–107 in the display panel base section 101a, the moisture and organic gas emitted from the partition walls 105 will be closed up within the internal space, and invade gradually into the organic electroluminescent layers 106 through the pin holes formed on the second type electrodes 107, also through an interface between the electrodes 107 and the electroluminescent layers 106, as shown in FIG. 9a. As a result, non-luminous ereas (dark spots) will increase on the electroluminescent layers 106.

Under a condition shown in FIG. 7b where a protection layer 109 is formed to cover up all the elements 103–107 in the display panel base section 101a, the moisture and organic gas emitted from the partition walls 105 will be closed up under the protection layer 109, and invade gradually into the organic electroluminescent layers 106 through the interface between the electrodes 107 and the electroluminescent layers 106, as shown in FIG. 9*b*. As a result, non-luminous areas (dark spots) will increase on the electroluminescent layers 106.

SUMMARY OF THE INVENTION

It is an object of the present invention to provide an improved display panel capable of preventing an invasion of a moisture and/or an organic gas into an electroluminescent layer within the display panel, so as to solve the above-mentioned problems peculiar to the above-mentioned prior art.

According to the present invention, there is provided a display panel using an organic electroluminescent material, the display panel comprising: a substrate; a plurality of first type electrodes arranged in parallel at a predetermined interval on the surface of one side of the substrate; a plurality of electrically insulating partition walls partially covering the first type electrodes, arranged at a predetermined interval in a direction orthogonal to the first type electrodes on the substrate; a plurality of organic electroluminescent layers formed on exposed portions of the first type electrodes, arranged in parallel with said partition walls; a plurality of second type electrodes formed on the organic electroluminescent layers in parallel therewith, each disposed between two partition walls; and a protection layer formed on the substrate to cover and seal up the first type electrodes, the electrically insulating partition walls, the organic electroluminescent layers, and the second type electrodes. In particular, the protection layer has a plurality of openings each of which is formed adjacent to a side face of a partition wall so as to partially expose the side face.

In one aspect of the present invention, each of the electrically insulating partition walls has a cross section formed into an inverted trapezoidal shape having an overhang angle with a vertical axis X.

In another aspect of the present invention, each of the electrically insulating partition walls is made of a photosensitive sensitive resin.

In a further aspect of the present invention, the protection layer is a deposition layer having a low moisture permeability, formed by vapor deposition using a deposition material such as a metal oxide, with the formed layer having a thickness of 1–10 $\mu$m.

The present invention further provides a method of producing a display panel using an organic electroluminescent material. The method comprises the steps of: forming a plurality of first type electrodes arranged in parallel at a predetermined interval on the surface of one side of the substrate; forming a plurality of electrically insulating partition walls partially covering the first type electrodes, arranged at a predetermined interval in a direction orthogonal to the first type electrodes on the substrate; forming a plurality of organic electroluminescent layers on exposed portions of the first type electrodes, arranged in parallel with the partition walls; forming a plurality of second type electrodes on the organic electroluminescent layers in parallel therewith, each disposed between two partition walls; forming a protection layer on the substrate to cover and seal up the first type electrodes, the electrically insulating partition walls, the organic electroluminescent layers, and the second type electrodes; forming a plurality of openings on the protection layer, each of which is adjacent to a side face of a partition wall so as to partially expose the side face.

The above objects and features of the present invention will become more understood from the following description with reference to the accompanying drawings.

BRIEF DESCRIPTION OF DRAWINGS

FIGS. 2*a*–2*c* are cross sectional views illustrating several important steps involved in a process of producing a display panel according to the first embodiment of the present invention.

FIGS. 4*a*–4*c* are cross sectional views illustrating several important steps involved in a process of producing a display panel according to the second embodiment of the present invention.

FIGS. 7*a* and 7*b* are cross sectional views illustrating a glass cover or a protection layer is used to seal up a base section of a display panel according to a prior art.

FIGS. 8*a*–8*d* are cross sectional views illustrating various steps involved in a process of producing a display panel according to a prior art.

FIGS. 9*a* and 9*b* are cross sectional views illustrating that a moisture or an organic gas invades into an organic electroluminescent layer where a glass cover or a protection layer is used to seal up a base section of a display panel according to a prior art.

DETAILED DESCRIPTION OF THE PREFERRED EMBODIMENTS

FIGS. 1*a*–1*e* shows a process for producing an improved display panel of the present invention, according to a first embodiment thereof.

Figure 1:
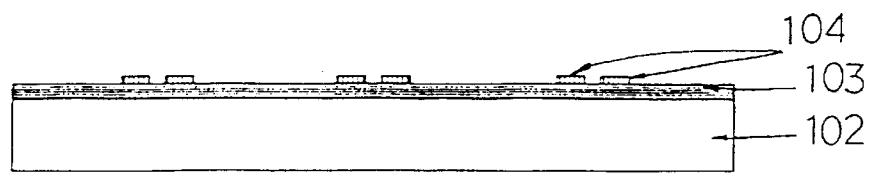
FIGS. 1*a*–1*e* are cross sectional views illustrating various steps involved in a process of producing a display panel according to a first embodiment of the present invention.
Figure 1:
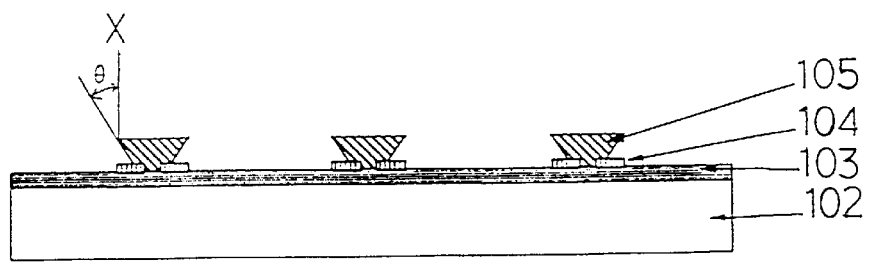
Figure 1:
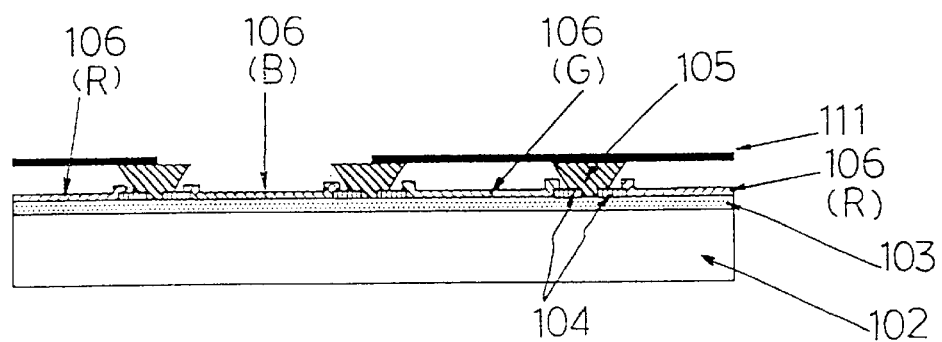
Figure 1:
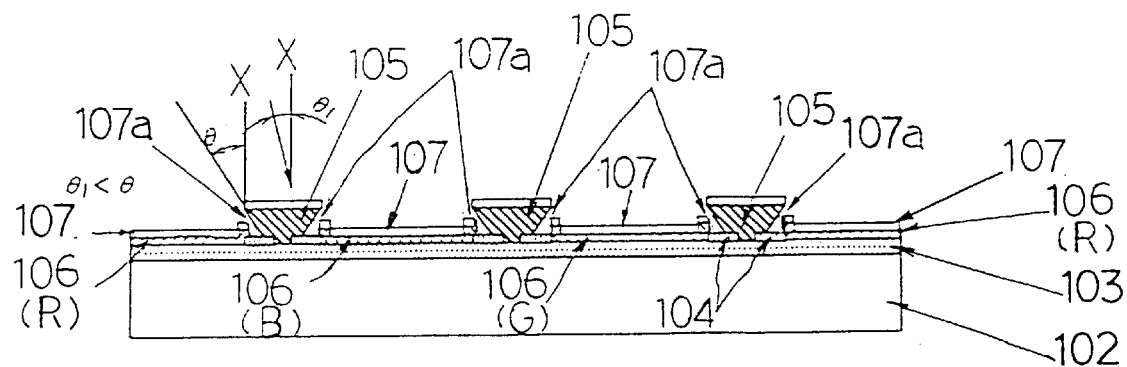
Figure 1:
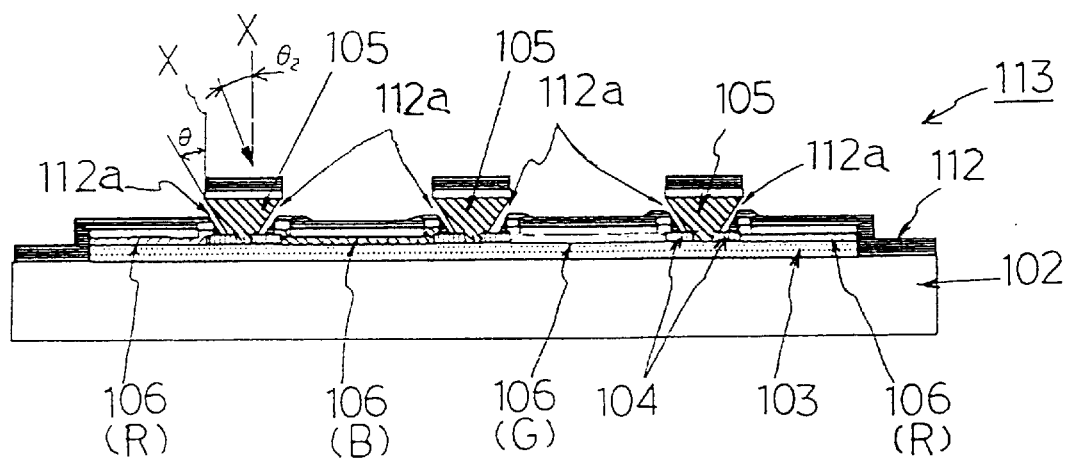

At first, as shown in FIG 1*a*, a plurality of first type electrodes 103 consisting of an electrically conductive transparent layer such as ITO are formed on the surface of one side of a transparent glass substrate 102. Then, a plurality of elongate electrically insulating layers 104 are formed in a direction orthogonal to the first type electrodes 103.

Afterwards, as shown in FIG 1*b*, a plurality of electrically insulating partition walls 105 are formed in parallel with the elongate electrically insulating layers 104 on the glass substrate 102. Each partition wall 105 has a cross section formed into an inverted trapezoidal shape having an overhang angle θ with a vertical axis X.

Subsequently, as shown in FIG 1*c*, with the use of a mask 111 punched in accordance with a predetermined pattern, a plurality of organic electroluminescent layers 106 having red luminescent units R, green luminescent units G and blue luminescent units B, are formed on exposed portions of the first type electrodes 103.

Further, as shown in FIG 1*d*, a metal of low electric resistance such as Al, Cu or Au is vapor deposited on the organic electroluminescent layers 106 so as to form thereon a plurality of second type electrodes 107.

When the above metal is vapor deposited, the deposition direction is controlled within an angle θ1 which is smaller than the above angle θ, so that the metal may be prevented from being deposited onto the side walls of the partition walls 105. In this way, the metals deposited on the top of each partition wall 105 is separated from adjacent second type electrodes 107, thereby preventing any possible short between two adjacent electrodes 107. Moreover, the angle θ1 is so controlled that it is possible not only to have a metal deposited on the top of each partition wall 105 separated from an adjacent second type electrodes 107, but also to have each second type electrode 107 separated from the side faces of partition walls 105, thereby forming openings 107a therebetween.

After that, as shown in FIG 1e, a deposition material having a low moisture permeability is vapor deposited on all the exposed surfaces on the display panel base section so as to form a protection layer 112 thereon, thereby producing a display panel 113.

When the above deposition material is vapor deposited, the deposition direction is controlled within an angle θ2 which is smaller than the above angle θ but larger than the above angle θ1, so that the inner surface of each opening 107a may also be coated with the same deposition material. In this way, since all the exposed surfaces such as the second type electrodes 107 (including portions extending into the inner surfaces of the openings 107a), the organic electroluminescent layers 106, and the electrically insulating layers 104, are all covered and sealed up by the protection layer 112, it is possible to effectively shut out any possible invasion of an outside moisture.

Further, if the deposition process for forming the protection layer 112 is controlled within an appropriate time, it can be made sure to prevent the deposition material from blocking the openings 107a, thereby forming a protection layer 112 having a plurality of openings 112a.

Moreover, since the moisture or organic gas produced from the partition walls 105 are allowed to escape through the openings 112a, the electroluminescent layers 106 and other elements covered by the protection layer 112 are usually kept at a lower temperature and a lower humidity than those of the above described prior art.

Figure 2C:
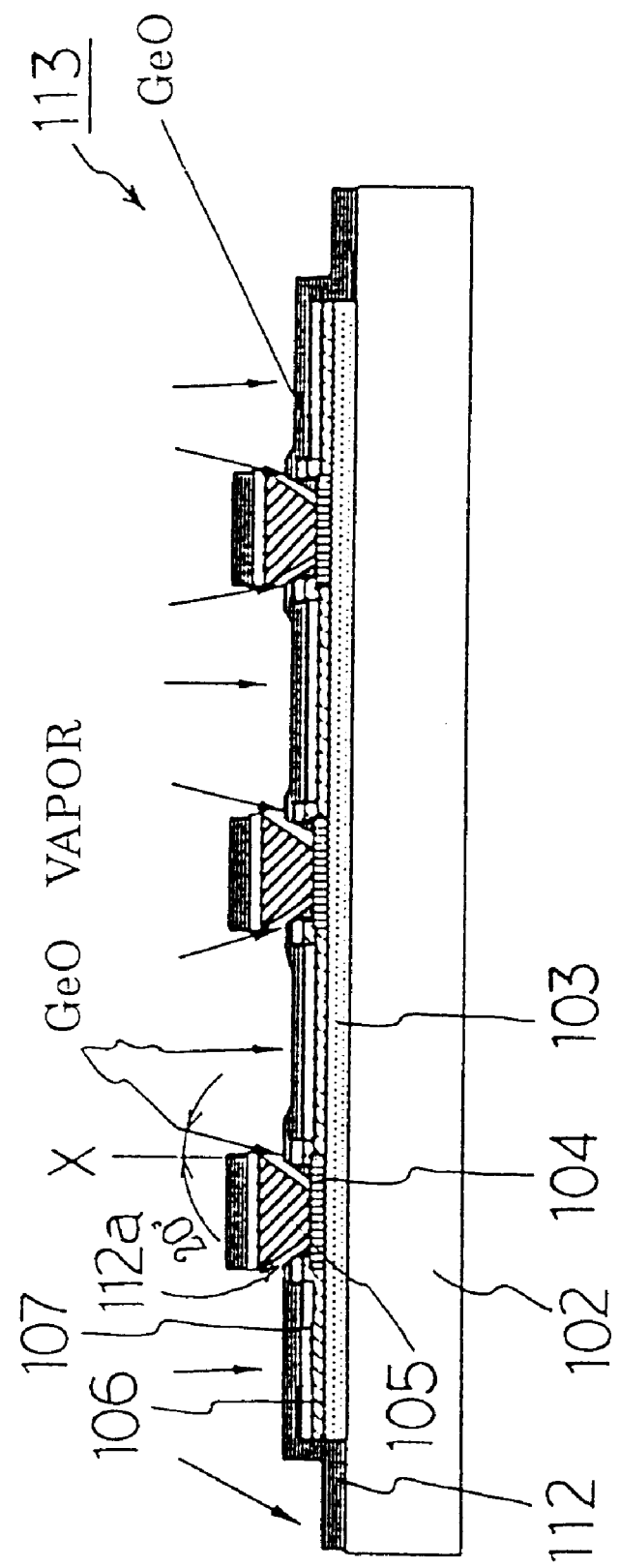

FIGS. 2a–2c illustrate in more detail an example for manufacturing a display panel of the present invention, according to the first embodiment.

After a plurality of first type electrodes 103 consisting of an electrically conductive transparent material such as ITO are formed on a transparent glass substrate 102, the glass substrate 102 is washed sufficiently. Then, a plurality of electrically insulating layers 104 consisting of $SiO_2$ having a width of 40 μm are formed in a direction orthogonal to the first type electrodes 103. Subsequently, a plurality of partition walls 105 consisting of an organic photoresist material are formed on the electrically insulating layers 04. Each partition wall 105 has a cross section formed into an inverted trapezoidal shape having an upper width of 30 μm, and an overhang angle θ of at most 30 degree with respect to a vertical axis X, as shown in FIG. 2a.

Referring to FIG. 2b, a TPD layer having a thickness of 700 angstrom and a $Alq_3$ layer having a thickness of 550 angstrom are formed respectively and laminated together so as to produce an organic electroluminescent layer 106. Further, a metal layer such as an Al1 layer having a thickness of 1000 angstrom is vapor deposited on the electroluminescent layers 106 so as to form second type electrodes 107. At this moment, Al vapor is generated from an Al vapor source (not shown) and deposited on the layers 106 in an inclined angle θ which is at most 10 degree with respect to a vertical axis X. In this way, each second type electrode 107 is separated from the side faces of partition walls 105, thereby forming openings 107a therebetween.

Referring to FIG. 2c, GeO is vapor deposited on the display base section 102 covering the partition walls 105, the organic electroluminescent layers 106 and other elements so as to form a protection layer 112 having a thickness of 3 μm. At this moment, GeO vapor is generated from an GeO vapor source (not shown) and deposited in an inclined angle θ which is about 10 degree with respect to a vertical axis X, thereby producing a display panel 113.

In this way, since all the exposed surfaces such as the second type electrodes 107 (including portions extending into the inner surfaces of the openings 107a), the organic electroluminescent layers 106, and the electrically insulating layers 104, are all covered and sealed up by the protection layer 112, it is possible to effectively shut out any possible invasion of an outside moisture.

After a display panel prepared in the above-discussed manner had been tested for its heat resistant property under a temperature of 100° C. for 500 hours, an observation was performed to check whether or not non-luminous areas (dark spots) have increased on the electroluminescent layers 106, but did not find any such increase.

FIGS. 3a–3e shows a process for producing an improved display panel of the present invention, according to a second embodiment thereof.

Figure 3:
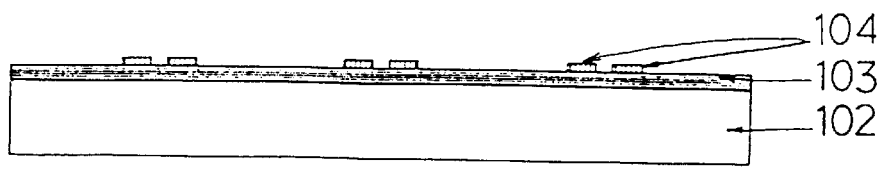
FIGS. 3*a*–3*e* are cross sectional views illustrating various steps involved in a process of producing a display panel according to a second embodiment of the present invention.
Figure 3:
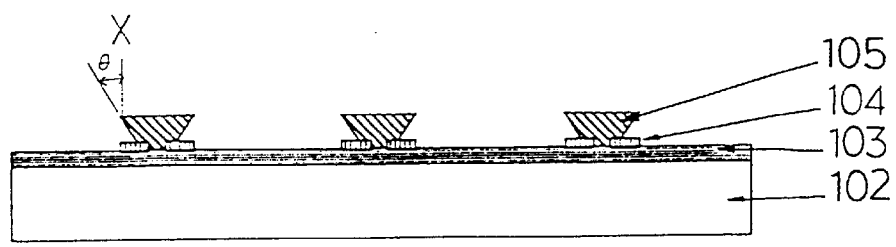
Figure 3:
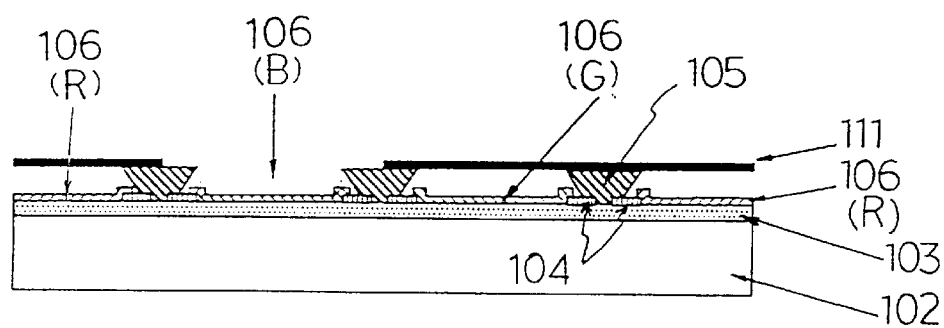
Figure 3:
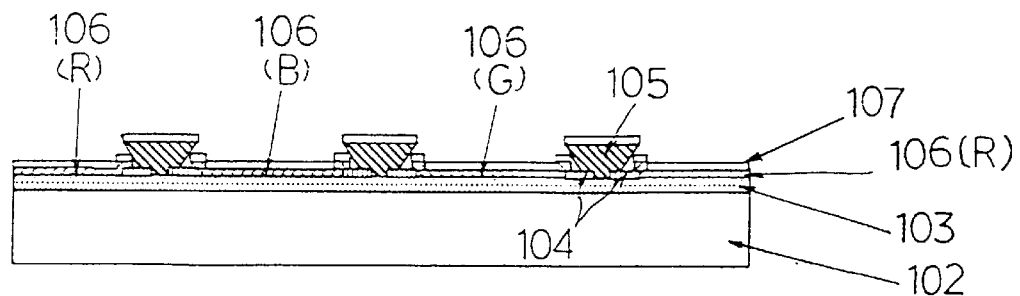
Figure 3:
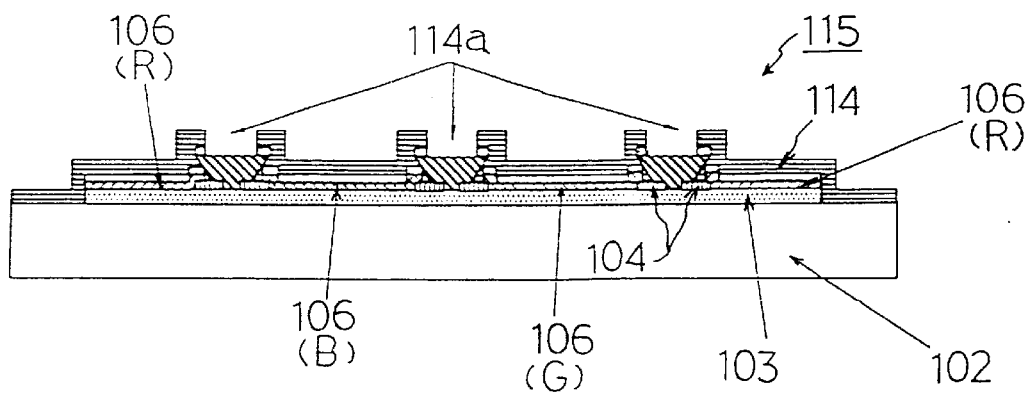
Figure 5:
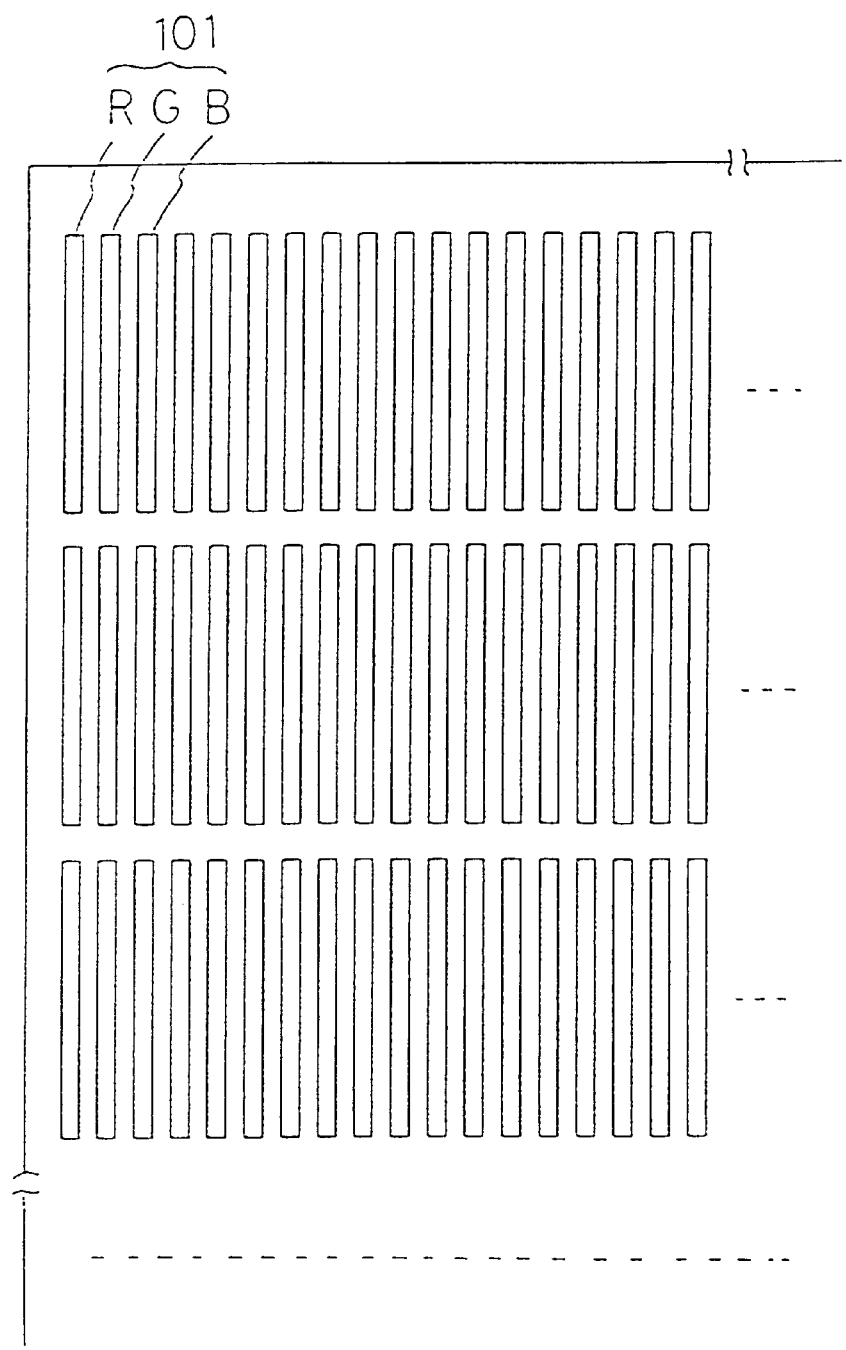
FIG. 5 is a plane view illustrating an arrangement of picture elements on a display panel according to a prior art.
Figure 6:
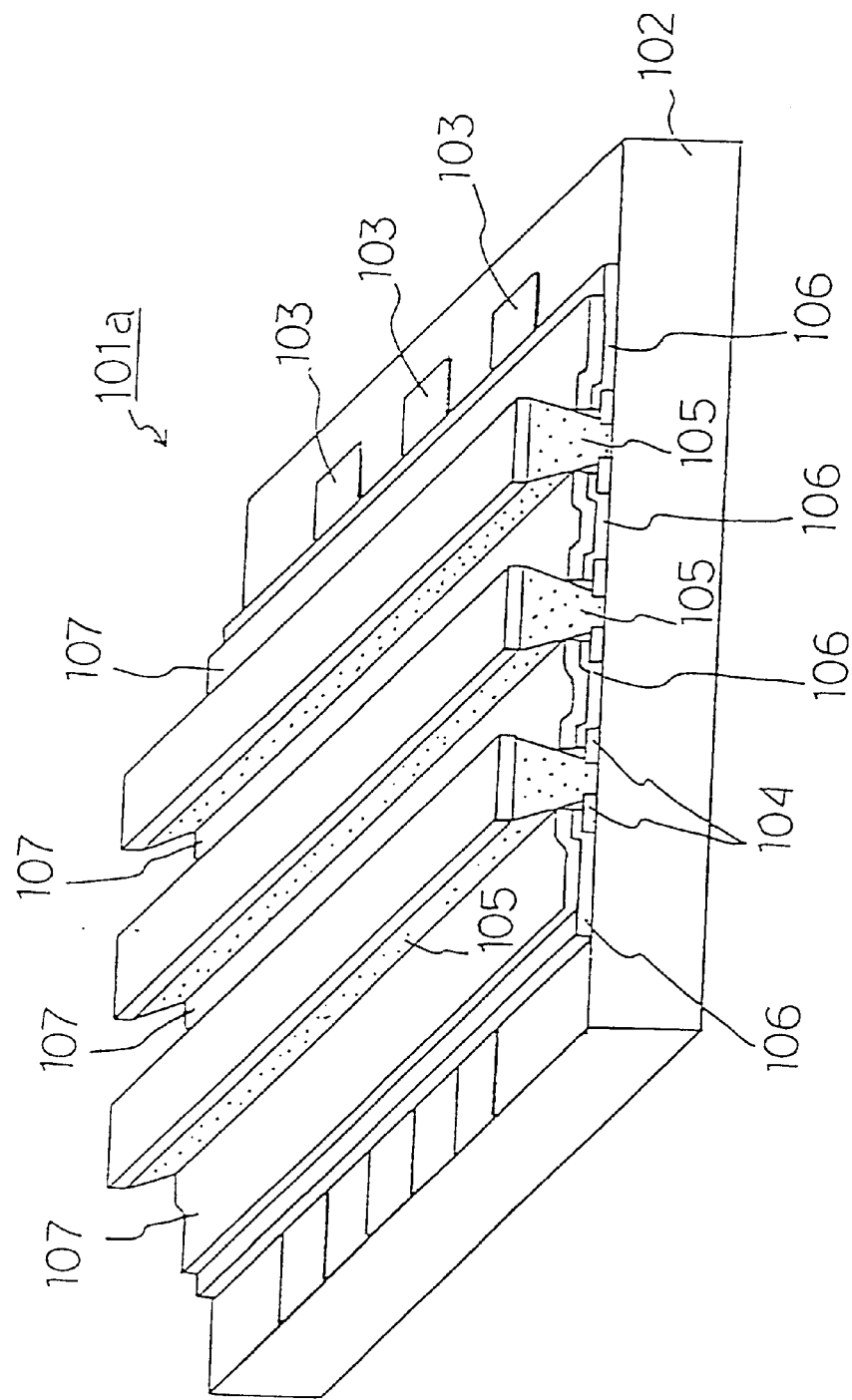
FIG. 6 is a perspective view illustrating a base section of a display panel according to a prior art.
Figure 8C:
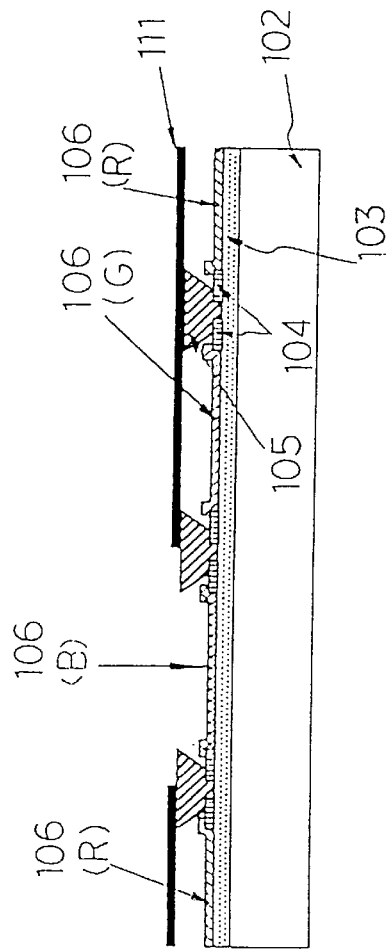
Figure 8D:
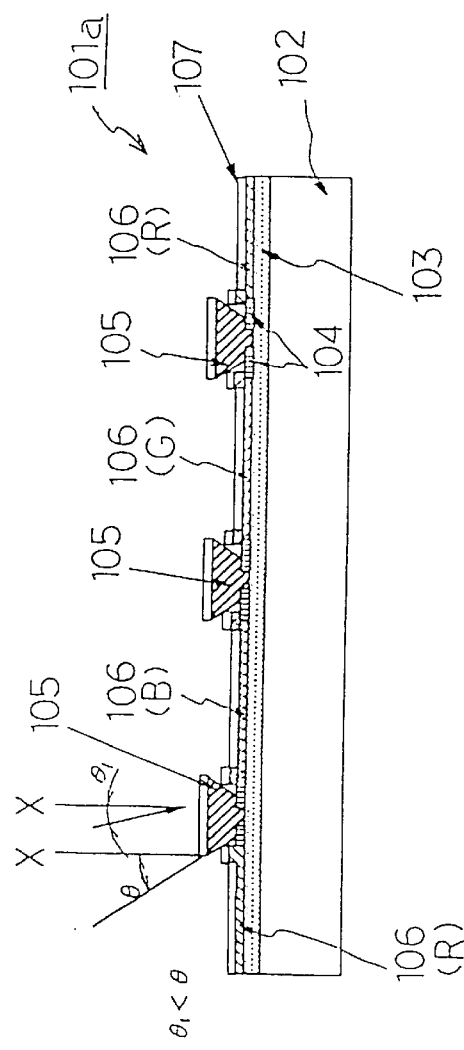

At first, as shown in FIG. 3a, a plurality of first type electrodes 103 consisting of an electrically conductive transparent material such as ITO are formed on the surface of one side of a transparent glass substrate 102. Then, a plurality of elongate electrically insulating layers 104 are formed in a direction orthogonal to the first type electrodes 103.

Afterwards, as shown in FIG. 3b, a plurality of electrically insulating partition walls 105 are formed partly over the elongate electrically insulating layers 104 on the glass substrate 102. Each partition wall 105 has a cross section formed into an inverted trapezoidal shape having an overhang angle θ with a vertical axis X.

Subsequently, as shown in FIG. 3c, with the use of a mask 111 punched in accordance with a predetermined pattern, the organic electroluminescent layers 106 having red luminescent units R, green luminescent units G and blue luminescent units B, are formed on exposed portions of the first type electrodes 103.

Further, as shown in FIG. 3d, a metal of low electric resistance such as Al, Cu or Au is vapor deposited on the organic electroluminescent layers 106 so as to form thereon a plurality of second type electrodes 107.

After that, as shown in FIG. 3e, a deposition material having a low moisture permeability is vapor deposited on all the exposed surfaces on the display panel base section so as to form a protection layer 114 thereon, thereby completely covering the partition walls 105, the organic electroluminescent layers 106 and second type electrodes 107.

Further, as shown in FIG. 3e, a laser beam is used to irradiate the top of each partition wall 105 to partially remove the protection layer 114, so as to form openings 114a thereon, thereby producing a display panel 115.

In this way, since the moisture and organic gas produced from the partition walls 105 are allowed to escape through the openings 114a, the electroluminescent layers 106 and other elements covered by the protection layer 114 may be allowed to be kept at a lower temperature and a lower humidity than those of the above described prior art.

FIGS. 4a–4c illustrate in more detail an example for manufacturing a display panel of the present invention, according the second embodiment thereof.

After a plurality of first type electrodes 103 consisting of an electrically conductive transparent material such as ITO are formed on the surface of one side of a transparent glass substrate 102, the glass substrate 102 is washed sufficiently. Then, a plurality of electrically insulating layers 104e of $SiO_2$ having a width of 40 μm are formed in a direction orthogonal to the first type electrodes 103. Subsequently, a plurality of partition walls 105 made of an organic photo resist material are formed on the electrically insulating layers 104. Each partition wall 105 has a cross section formed into an inverted trapezoidal shape having an upper width of 30 μm, and an extended line along its inclined side face forms an overhang angle of at most 30 degrees with respect to a vertical axis.

Referring to FIG. 4b, a TPD layer having a thickness of 700 angstroms and a $Alq_3$ layer having a thickness of 550 angstroms are formed respectively and laminated together to produce organic electroluminescent layers 106. Further, a metal layer such as an Al layer having a thickness of 1000 angstroms is vapor deposited on the electroluminescent layers 106 so as to form second type electrodes 107. After that, a plasma CVD (Chemical Vapor Deposition) is performed to deposit $SiO_2$ to form a protection layer 114 to seal up the partition walls 105, second type electrodes 107 and other elements on the glass substrate 102.

Then, as shown in FIG. 4c, a laser beam is used to irradiate the top of each partition wall 105 to partially remove the protection layer 114, so as to form openings 114a thereon, thereby producing a display panel 115.

After a display panel prepared in the above-discussed manner had been tested for its heat resistance under a temperature of 100° C. for 500 hours, an observation was performed to check whether or not non-luminous areas (dark spots) have increased on the electroluminescent layers 106, but did not find any such increase.

As is understood from the above description, with the use of the present invention, an outside moisture can be completely shut out by a specifically formed protection layer 112 or 114, and a moisture and organic gas generated from the partition walls 115 are allowed to escape through the openings 112a or 114a specifically formed on the protection layers 112 or 114, the electroluminescent layers 106 and other elements covered by the protection layer 112 or 114 may be allowed to be kept at a lower temperature and a lower humidity than those of the above described prior art, thereby enabling a display panel of the present invention to have a longer usable life than that of a prior art display panel.

While the presently preferred embodiments of the this invention have been shown and described above, it is to be understood that these disclosures are for the purpose of illustration and that various changes and modifications may be made without departing from the scope of the invention as set forth in the appended claims.

What is claimed is:

1. A display panel using an organic electroluminescent material, said display panel comprising:
    a substrate;
    a plurality of first type electrodes arranged in parallel at a predetermined interval on the surface of one side of the substrate;
    a plurality of electrically insulating partition walls partially covering the first type electrodes, arranged at a predetermined interval in a direction orthogonal to the first type electrodes on the substrate;
    a plurality of organic electroluminescent layers formed on exposed portions of the first type electrodes, arranged in parallel with said partition walls;
    a plurality of second type electrodes formed on the organic electroluminescent layers in parallel therewith, each disposed between two partition walls; and
    a protection layer formed on the substrate to cover and seal up the first type electrodes, the electrically insulating partition walls, the organic electroluminescent layers, and the second type electrodes;
    wherein the protection layer has a plurality of openings each of which is formed adjacent to a side face of a partition wall so as to partially expose the side face.

2. A display panel using an organic electroluminescent material, said display panel comprising:
    a substrate;
    a plurality of first type electrodes formed on the surface of one side of the substrate;
    a plurality of electrically insulating partition walls partially covering the first type electrodes;
    a plurality of organic electroluminescent layers formed on exposed portions of the first type electrodes;
    a plurality of second type electrodes formed on the organic electroluminescent layers; and
    a protection layer formed on the above one side of the substrate to cover and seal up the first type electrodes, the electrically insulating partition walls, the organic electroluminescent layers, and the second type electrodes;
    wherein the protection layer has a plurality of openings each of which is formed adjacent to a side face of a partition wall so as to partially expose the side face.

3. A display panel according to claim 2, wherein each of the electrically insulating partition walls has a cross section formed into an inverted trapezoidal shape having an overhang angle with a vertical axis X.

4. A display panel according to claim 2, wherein each of the electrically insulating partition walls is made of a photo-sensitive resin.

5. A display panel according to claim 2, wherein the protection layer is a deposition layer having a low moisture permeability, formed by vapor deposition using a deposition material such as a metal oxide, with the formed layer having a thickness of 1–10 μm.

6. A method of producing a display panel using an organic electroluminescent material, comprising the steps of:
    forming a plurality of first type electrodes on the surface of one side of a substrate;
    forming a plurality of electrically insulating partition walls partially covering the first type electrodes;
    forming a plurality of organic electroluminescent layers on exposed portions of the first type electrodes;
    forming a plurality of second type electrodes on the organic electroluminescent layers;
    forming a protection layer on the substrate to cover and seal up the first type electrodes, the electrically insulating partition walls, the organic electroluminescent layers, and the second type electrodes; and
    forming a plurality of openings on the protection layer, each of which is adjacent to a side face of a partition wall so as to partially expose the side face.

7. A method of producing a display panel using an organic electroluminescent material, comprising the steps of:
    forming a plurality of first type electrodes arranged in parallel at a predetermined interval on the surface of one side of a substrate;

forming a plurality of electrically insulating partition walls partially covering the first type electrodes, arranged at a predetermined interval in a direction orthogonal to the first type electrodes on the substrate;

forming a plurality of organic electroluminescent layers on exposed portions of the first type electrodes, arranged in parallel with the partition walls;

forming a plurality of second type electrodes on the organic electroluminescent layers in parallel therewith, each disposed between two partition walls;

forming a protection layer on the substrate to cover and seal up the first type electrodes, the electrically insulating partition walls, the organic electroluminescent layers, and the second type electrodes;

forming a plurality of openings on the protection layer, each of which is adjacent to a side face of a partition wall so as to partially expose the side face.

* * * * *